United States Patent
Lu et al.

(10) Patent No.: US 8,502,593 B2
(45) Date of Patent: Aug. 6, 2013

(54) BALANCED DEBOUNCE CIRCUIT WITH NOISE FILTER FOR DIGITAL SYSTEM

(75) Inventors: Robin Lu, San Jose, CA (US); Yan Zhang, Cupertino, CA (US)

(73) Assignee: Broadcom Corporation, Irvine, CA (US)

(*) Notice: Subject to any disclaimer, the term of this patent is extended or adjusted under 35 U.S.C. 154(b) by 1582 days.

(21) Appl. No.: 11/080,296

(22) Filed: Mar. 14, 2005

(65) Prior Publication Data

US 2006/0076984 A1     Apr. 13, 2006

Related U.S. Application Data

(60) Provisional application No. 60/618,208, filed on Oct. 13, 2004.

(51) Int. Cl.
*H03K 17/16* (2006.01)
(52) U.S. Cl.
USPC .............................. 327/386; 327/34; 327/551
(58) Field of Classification Search
USPC ................... 327/385, 386, 374, 378, 384, 34, 327/551
See application file for complete search history.

(56) References Cited

U.S. PATENT DOCUMENTS

| | | | | |
|---|---|---|---|---|
| 3,725,680 A * | 4/1973 | Silva | | 327/385 |
| 4,417,155 A * | 11/1983 | Aizawa | | 327/386 |
| 4,479,065 A * | 10/1984 | Aizawa | | 327/386 |
| 4,594,724 A * | 6/1986 | Hogan | | 375/219 |
| 5,027,019 A * | 6/1991 | Shiohara | | 327/386 |
| 5,878,006 A * | 3/1999 | Jung | | 369/44.28 |
| 6,356,099 B1 * | 3/2002 | Lee et al. | | 326/24 |
| 6,438,178 B1 * | 8/2002 | Lysdal et al. | | 375/317 |
| 6,525,980 B1 * | 2/2003 | Au et al. | | 365/189.011 |
| 6,670,831 B2 * | 12/2003 | Mashimo | | 327/34 |
| 2006/0109038 A1 * | 5/2006 | Easwaran | | 327/158 |

* cited by examiner

*Primary Examiner* — Long Nguyen
(74) *Attorney, Agent, or Firm* — Sterne, Kessler, Goldstein & Fox P.L.L.C.

(57) ABSTRACT

A circuit and method for debouncing an electrical signal are disclosed. A representative embodiment of the present invention may be set to remove (i.e., filter) noise or glitches in the low and high portions of an input signal, where the width of the noise or glitches while in the high or low state may be set using a programming interface. The filtering is done in a manner that results in a clean, debounced output signal having a low portion approximately equal to the low portion of the input signal, and a high portion approximately equal to the high portion of the input signal. Noise or glitches of less than programmable high or low glitch widths are filtered from the input signal and do not appear in the output signal.

20 Claims, 12 Drawing Sheets

BALANCED DEBOUNCE CIRCUIT WITH NOISE FILTER FOR DIGITAL SYSTEM

RELATED APPLICATIONS

This application makes reference to, claims priority to, and claims the benefit of U.S. Provisional Patent Application Ser. No. 60/618,208, entitled "Balanced Debounce Circuit With Noise Filter For Digital System," filed Oct. 13, 2004, the complete subject matter of which is hereby incorporated herein by reference, in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

In general, electronic devices having mechanical switches as input signals must cope with the erratic signal behavior that typically occurs when the switch is activated and deactivated. For example, a keypad button for a cellular handset typically generates a bouncing signal while the keypad button is being pressed and released. The length of the period during which the bouncing occurs varies depending upon the switch or button and may, for example, range from several microseconds, to fifty milliseconds or more. For instance, the keypad button used in a cellular phone typically generates a signal that bounces for approximately 20 milliseconds. In most electronic devices, the bouncing or "glitching" of the keypad button signal must be filtered, because the keypad button or switch input is used to trigger digital logic such as, for example, a processor interrupt. If the bouncing or "glitching" is not removed, the processor may operate erratically, producing unexpected results. The process of removing or filtering the bounces or "glitches" from the button signal is typically referred to as "debouncing". By debouncing the signal from a switch or button, the electronic device is able to base its operation upon a clean version of the user input.

Many different methods are used to debounce input signals from mechanical switches. Most debouncing is done using an analog circuit such as, for example, a capacitor, and a gate with a Schmitt input. This type of analog method has drawbacks including, for example, the need for additional discrete components (e.g., a capacitor), a lack of flexibility, and the added cost of the components. Electronic devices having a processor sometimes use software algorithms to filter inputs with bouncing signals. Such debounce software may use a significant amount of the processor capacity, may degrade system performance, and may cause the failure of the entire software system of the electronic device. Digital debounce filters are sometimes used, but are typically inflexible regarding debounce parameters, may only filter signal bounce in one direction, are susceptible to noise, and are difficult to test using design simulation tools.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A circuit and method for debouncing an input signal having at least a first state and a second state, substantially as shown in and/or described in connection with at least one of the figures, as set forth more completely in the claims.

These and other advantages, aspects, and novel features of the present invention, as well as details of illustrated embodiments, thereof, will be more fully understood from the following description and drawings.

DETAILED DESCRIPTION OF THE INVENTION

Aspects of the present invention are related to the processing of real-world signals for use in electronic circuitry. More specifically, aspects of the present relate to a method of removing bounce or glitches from the signals of mechanical switches, to produce a clean or debounced version of the input signal. Although reference is made herein to the debouncing of signals produced by mechanical switches, the present invention is not limited in this regard. Various embodiments of the present invention may have application in the debouncing of signals, or the filtering of noise, from other sources as well.

Figure 1:
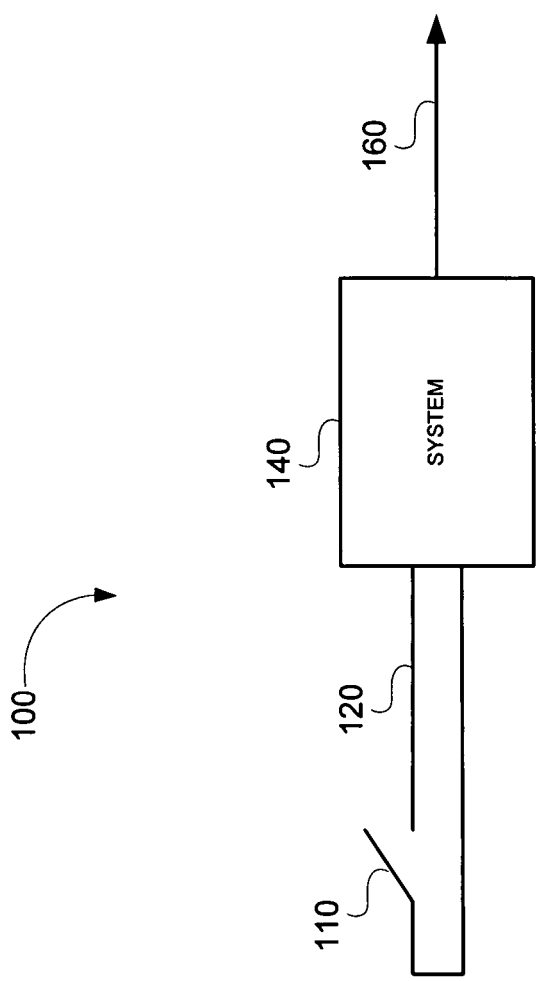
FIG. 1 shows a block diagram of an electronic device having a mechanical switch generating a signal that may exhibit bounces or glitches, in which a representative embodiment of the present invention may be practiced.

FIG. 1 shows a block diagram of an electronic device 100 having a mechanical switch 110 generating a signal 120 that may exhibit bounces or glitches, in which a representative embodiment of the present invention may be practiced. The switch 110 illustrated in FIG. 1 may comprise, for example, any type of switch using, for example, mechanical contacts, optical interrupter, or other form of electrical switch producing a signal 120 that bounces or glitches during activation or deactivation of the switch. The system 140 may comprise, for example, an electrical circuit for sensing the active or inactive state of the signal 120 of the switch 110. The system 140 may react to the states and/or transitions of the signal 120 of the switch 110, and may produce an output signal 160 that may represent, for example, one or more of an audible output, a visual output, a signal controlling a mechanical actuator, motor, solenoid, etc, and a data signal.

Figure 2A:
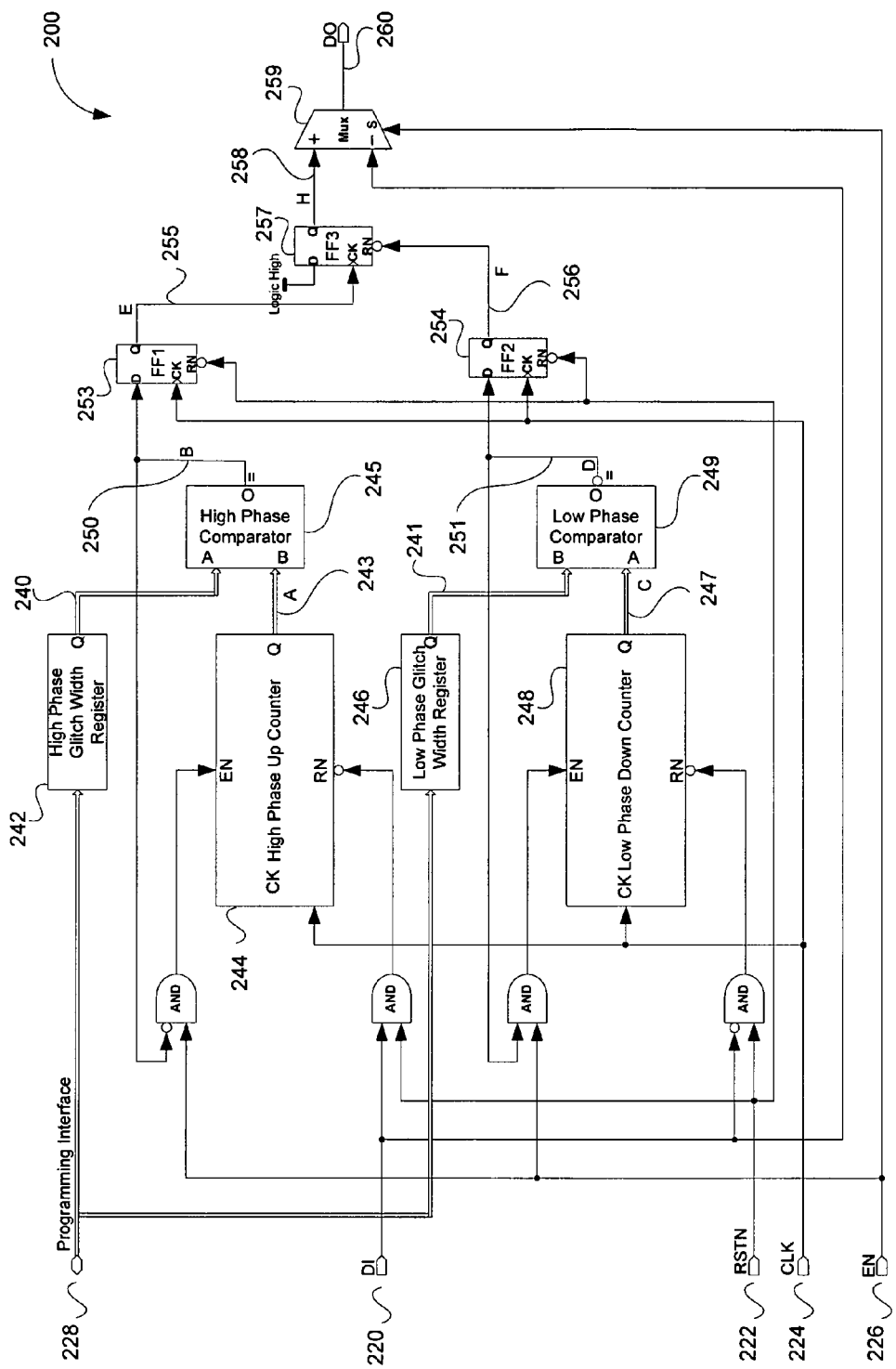
FIG. 2A is a block diagram of an exemplary debounce circuit for processing an input signal DI to produce an output signal, in accordance with a representative embodiment of the present invention.

FIG. 2A is a block diagram of an exemplary debounce circuit 200 for processing an input signal DI 220 to produce an output signal 260, in accordance with a representative embodiment of the present invention. As illustrated in FIG. 2A, the debounce circuit 200 comprises a high phase glitch width register 242, a high phase counter 244, a low phase glitch width register 246, and a low phase counter 248. In the debounce circuit 200 illustrated in FIG. 2A, the high phase counter 244 comprises an up-counter, while the low phase counter 248 comprises a down-counter. The high phase glitch width register 242 and the low phase glitch width register 246 receive the value of the high phase glitch width and low phase glitch width, respectively, via a programming interface 228. The debounce circuit 200 in the illustration of FIG. 2A accepts three input signals in addition to the raw, unmodified input signal DI 220 to be processed, and the programming interface 228. The EN signal 226 acts to enable the operation of the debounce circuit 200. When the EN signal 226 is at a low logic level (inactive), the multiplexer 259 is configured to route the input signal DI 220 directly to the output of the debounce circuit 200, the output signal DO 260. In addition, when signal EN 226 is in the inactive state (low), the high phase counter 244, the low phase counter 248, the high phase comparator 245, and the low phase comparator 249 are stopped from activity to save power. The RSTN signal 222 of FIG. 2A acts as an active-low reset signal to the high phase counter 244, the low phase counter 248, flip-flop FF1 253, and flip-flop FF2 254. In one representative embodiment of the present invention, the reset of the high phase counter 244 sets the value of the high phase counter 244 to "all-zeros", while resetting the low phase counter 248 sets the value of the low phase counter 248 to "all ones". Signal CLK 224 acts as a clock input to the high phase counter 244, the low phase counter 248, flip-flop FF1 253, and flip-flop FF2 254. In the illustration of FIG. 2A, the output A 243 represents the current value of the high phase counter 244, and the output C 247 represents the current value of the low phase counter 248.

In the debounce circuit 200 illustrated in FIG. 2A, when signal RSTN 222 is at a high logic level (inactive), the high logic level of the input signal DI 220 permits the high phase counter 244 to begin counting upward from the "all zeros" state. At the same time, the high logic level of the input signal DI 220 holds the low phase counter 248 in a reset condition (i.e., all ones). A low logic level at the input signal DI 220 permits the low phase counter 248 to begin counting downward from the "all ones" state, and simultaneously holds the high phase counter 244 in a reset condition (i.e., all zeros). The output A 243 of the high phase counter 244 is compared by the high phase comparator 245 with the high phase glitch width value in the high phase glitch width register 242. In a similar fashion, the output C 247 of the low phase counter 248 is compared by low phase comparator 249 with the low phase glitch width value in the low phase glitch width register 246. As described above, the values in the high phase glitch width register 242 and the low phase glitch width register 246 may be loaded via the programming interface 228.

As shown in the illustration of FIG. 2A, the high phase counter 244 increments at every rising edge of the clock signal CLK 224, when the raw (i.e., not debounced) input signal DI 220 is at a high logic level, signal EN 226 is active (high), and signal RSTN is inactive (high). When the value in the high phase counter 244 matches the value in the high phase glitch width register 242, the output B 250 of the high phase comparator 245 is set to an active high logic level. That is, when the value 243 at the "B"0 input of high phase comparator 245 is equal to the value 240 at the "A" input, the output B 250 of the high phase comparator 245 is set to a high logic level. Additionally, the signal B 250 stops the high phase counter 244 from incrementing, and the high phase counter 244 remains at the value in the high phase glitch width register 242 until a reset of the high phase counter 244 is caused by the input signal DI 220, or by the reset signal RSTN 222. The high logic level of output B 250 is latched into the FF1 253 upon the next rising edge of the clock signal CLK 224, and triggers the output H 258 of the flip-flop FF3 257 to a high logic level at next second rising edge of the clock signal CLK224 that is passed to debounced output DO 260. In a representative embodiment of the present invention, positive glitches in the input signal DI 220 that are smaller in duration than the value in the high phase glitch width register 242 will not trigger the output H 258 of the flip-flop FF3 257 to a high logic level. In addition, the return of the input signal DI 220 to a low logic level will reset the high phase counter 244 and force signal B 250 to logic low level (inactive). The low logic level of signal B 250 is latched into the FF1 253 after one clock cycle. This transition of signal E 255 to a logic low level does not trigger the state of output H 258 of FF3 257 to a low logic level, because FF3 257 cannot be triggered by the high to low transition of signal E 255. By operating as described above, the debounce circuit 200 removes from the output DO 260 any positive glitches of the input signal DI 220 having a duration shorter than the value stored in the high phase glitch width register 242.

The debounce circuit 200 illustrated in FIG. 2A operates in a similar fashion when operating upon an input signal DI 220 that is active when at a low logic level. While the input signal DI 220 is at a high logic level, the low phase counter 248 is held in reset (i.e., "all ones"). When the input signal DI 220 is at a low logic level, the low phase counter 248 is enabled to decrement at every rising edge of the clock signal CLK 224 when signal EN 226 is active (high) and signal RSTN is inactive (high). When the low phase counter 248 matches the value in the low phase glitch width register 246, the output D 251 of the low phase comparator 249 is set to an active low logic level. That is, when the value 241 at the "B" input of the low phase comparator 249 is equal to the value C 247 at the "A" input, the output D 251 of the low phase comparator 249 is set to a low logic level. That value is latched into the flip-flop FF2 254 at the next rising edge of the clock signal CLK 224. Additionally, the signal B 251 stops the low phase counter 248 from decrementing, and the low phase counter 248 remains at the value in the low phase glitch width register 246 until a reset of the low phase counter 248 is caused by the input signal DI 220, or by the reset signal RSTN 222. The output F 256 of the flip-flop FF2 254 then changes to a low logic level, and the flip-flop FF3 257 is reset, forcing the output H 258 of the flip-flop FF3 257 to a low logic level that is passed to debounced output DO 260. If the duration of a low logic level portion (i.e., a "negative glitch") of the input signal DI 220 is shorter than the value in the low phase glitch width register 246, the value of low phase counter 248 will never match the value of the low phase glitch width register 246, and the output D of the comparator 249 will not go to a low logic level. Therefore, the flip-flop FF2 254 will not be reset, and will not reset the state of the flip-flop FF3 257. The output H 258 of the flip-flop FF3 257 will remain at a high logic level, and that value will be passed to the output signal DO 260 by multiplexer 259. Any change of input signal DI 220 to a high logic level will reset the low phase counter 248 to the "all ones" condition, forcing signal B 251 to a high logic level. The high logic level of signal B 251 is latched into flip-flop FF2 254 after one clock cycle. The high logic level of the output signal F 256 of FF2 254 does not trigger the reset of flip-flop FF3 257 because the high logic level of signal F 256 cannot reset flip-flop FF3 257. In this manner, any negative glitches (i.e., low logic level portion) in the input signal DI 220 having a duration of less than the value of the low phase glitch width register 246 will not be passed to the output DO 260.

Although the above discussion of the circuit of FIG. 2A describes the high phase counter 244 as an up-counter and the low phase counter 248 as a down-counter, this does not necessarily represent a limitation of the present invention. For example, either or both of the high phase counter 244 and low phase counter 248 may be up-counters or down-counters, without departing from the spirit and scope of the present invention. In another representative embodiment of the present invention, both the low phase counter 248 and the high phase counter 244 may be up-counters, and the low phase counter 248 and the high phase counter 244 may be reset to the "all-zeros" condition, during that portion of the input signal DI 220 that is in the low logic level and a high logic level, respectively. In such an embodiment, the inputs to the low phase comparator 249 may be swapped, and the high phase counter 244 and low phase counter 248 may count until their values equal the high phase glitch width register 242 and the low phase glitch width register 246, respectively.

The selection of the frequency of the clock signal CLK 224 depends upon the bounce or glitch characteristics of the input signal DI 220, and the width in bits of the high phase counter 244 and the low phase counter 248. For example, using a clock signal CLK 224 of 32.768 KHz, and a high phase counter 244 and low phase counter 248 having 10 bits, the debounce circuit illustrated in FIG. 2A is able to filter (i.e., remove) noise (i.e., glitches) up to $2^{10}/32768=31.25$ milliseconds (ms.) in length from the input signal DI 220. In an embodiment of the present invention, the frequency of the clock signal CLK 224 and the number of bits of both the high and low phase counters 244, 248 and the high and low phase glitch width registers 242, 246 may, for example, be increased to filter out (i.e., debounce) noise and glitches of greater width.

Figure 2B:
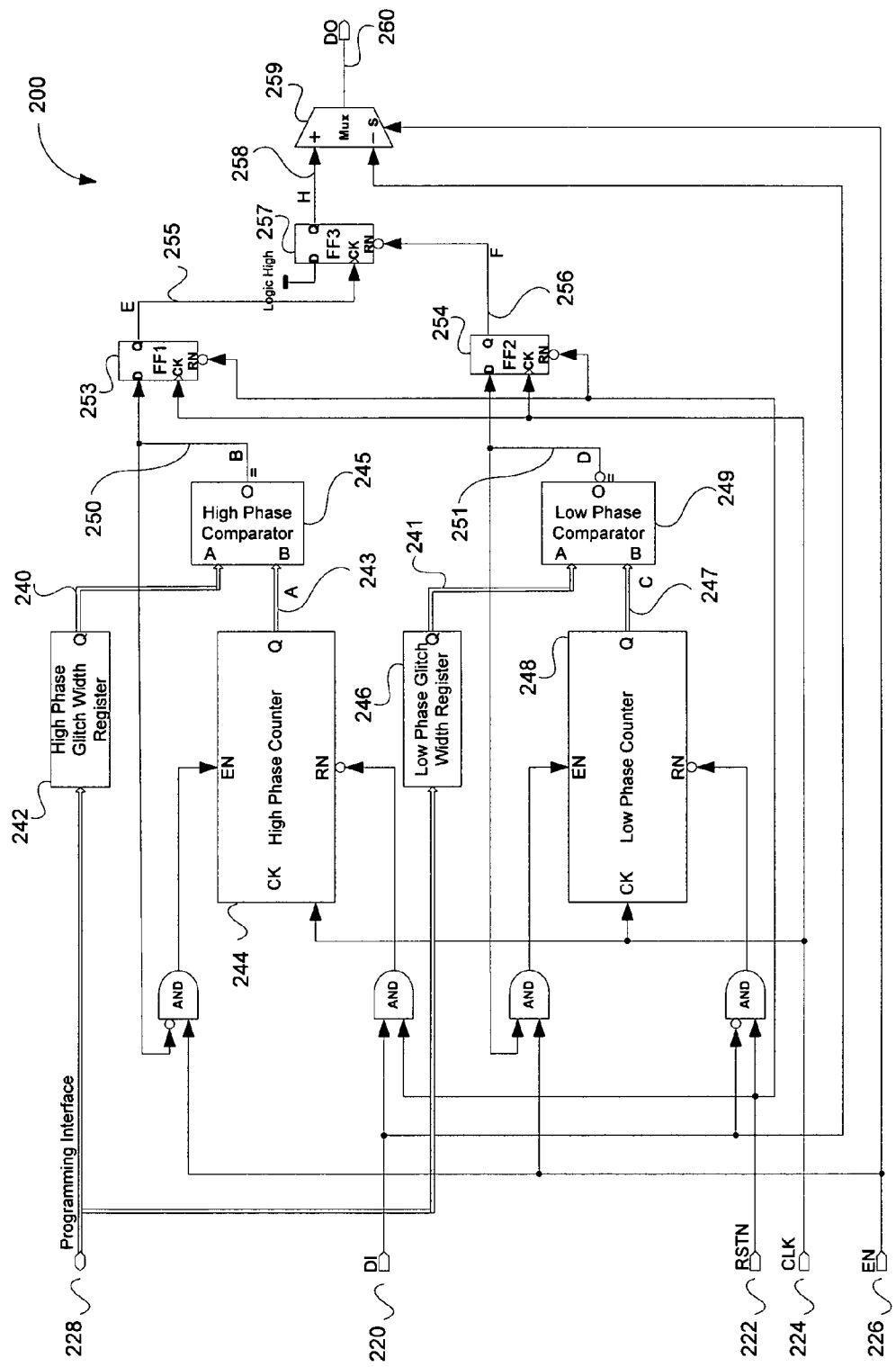
FIG. 2B is a block diagram of another exemplary debounce circuit for processing an input signal DI to produce an output signal, in accordance with a representative embodiment of the present invention.

FIG. 2B is a block diagram of another exemplary debounce circuit 200 for processing an input signal DI 220 to produce an output signal 260, in accordance with a representative embodiment of the present invention. As illustrated in FIG. 2B, the debounce circuit 200 comprises a high phase glitch width register 242, a high phase counter 244, a low phase glitch width register 246, and a low phase counter 248. Although in the debounce circuit 200 illustrated in FIG. 2B, both the high phase counter 244 and the low phase counter 248 comprise up-counters, this does not represent a limitation of the present invention. The high phase glitch width register 242 and the low phase glitch width register 246 receive the value of the high phase glitch width and low phase glitch width, respectively, via the programming interface 228. The debounce circuit 200 in the illustration of FIG. 2B accepts three input signals in addition to the raw, unmodified input signal DI 220 to be processed, and the host interface 228. The EN signal 226 acts to enable the operation of the debounce circuit 200. When the EN signal 226 is at a low logic level, the multiplexer 259 is configured to route the input signal DI 220 directly to the output of the debounce circuit 200, the output signal DO 260. In addition, when signal EN 226 is at a low logic level (inactive), the high phase counter 244, the low phase counter 248, the high phase comparator 245, and the low phase comparator 249 are stopped from activity to save power. The RSTN signal 222 of FIG. 2B acts as an active-low reset signal to the high phase counter 244, the low phase counter 248, flip-flop FF1 253, and flip-flop FF2 254. In the representative embodiment of the present invention shown in Fib. 2B, the reset of the high phase counter 244 sets the value of the high phase counter 244 to "all-zeros", and resetting the low phase counter 248 sets the value of the low phase counter 248 to "all-zeros". Signal CLK 224 acts as a clock input to the high phase counter 244, the low phase counter 248, flip-flop FF1 253, and flip-flop FF2 254. In the illustration of FIG. 2B, the output A 243 represents the current value of the high phase counter 244, and the output C 247 represents the current value of the low phase counter 248.

In the debounce circuit 200 illustrated in FIG. 2B, when signal RSTN 222 is at a high logic level (inactive), the high logic level of the input signal DI 220 permits the high phase counter 244 to begin counting upward from the "all-zeros" state. At the same time, the high logic level of the input signal DI 220 holds the low phase counter 248 in a reset condition (i.e., all-zeroes). A low logic level at the input signal DI 220 permits the low phase counter 248 to begin counting upward from the "all-zeros" state, and simultaneously holds the high phase counter 244 in a reset condition (i.e., all-zeros). The output A 243 of the high phase counter 244 is compared by the high phase comparator 245 with the high phase glitch width value in the high phase glitch width register 242. In a similar fashion, the output C 247 of the low phase counter 248 is compared by low phase comparator 249 with the low phase glitch width value in the low phase glitch width register 246. As described above, the values in the high phase glitch width register 242 and the low phase glitch width register 246 may be loaded via the programming interface 228.

As shown in the illustration of FIG. 2B, the high phase counter 244 increments at every rising edge of the clock signal CLK 224, when the raw (i.e., not debounced) input signal DI 220 is at a high logic level, the signal EN 226 is active (high), and the signal RSTN is inactive (high). When the value in the high phase counter 244 matches the value in the high phase glitch width register 242, the output B 250 of the high phase comparator 245 is set to an active high logic level. That is, when the value A 243 at the "B" input of the high phase comparator 245 is equal to the value 240 at the "A" input, the output B 250 of the high phase comparator 245 is set to high logic level. The high logic level of output B 250 is latched into the flip-flop FF1 253 upon the next rising edge of the clock signal CLK 224, and triggers the output H 258 of the flip-flop FF3 257 to a high logic level following the second rising edge of clock signal CLK 224. Additionally, the signal B 250 stops the high phase counter 244 from incrementing, and the high phase counter 244 remains at the value in the high phase glitch width register 242 until a reset of the high phase counter 244 is caused by the input signal DI 220, or the reset signal RSTN 222. In a representative embodiment of the present invention, positive glitches in the input signal DI 220 that are smaller in duration than the value in the high phase glitch width register 242 will not trigger the output H 258 of the flip-flop FF3 257 to a high logic level and will not be appear at debounced output DO 260. In addition, the return of the input signal DI 220 to a low logic level will reset the high phase counter 244 and force signal B 250 to a low logic level. That low logic level will be latched into FF1 253 after one clock cycle. The transition of the output signal E 255 to a low logic level does not trigger the state of flip-flop FF3 257 to a low logic level, because the high to low transition of signal E 255 cannot trigger FF3 257. By operating as described above, the debounce circuit 200 removes from the output DO 260 any positive glitches of the input signal DI 220 having a duration shorter than the value stored in the high phase glitch width register 242.

The debounce circuit 200 illustrated in FIG. 2B operates in a similar fashion when operating upon an input signal DI 220 that is active when at a low logic level. While the input signal DI 220 is at a high logic level, the low phase counter 248 is held in reset (i.e., "all-zeros"). When the input signal DI 220 is at a low logic level, the low phase counter 248 is enabled to increment at every rising edge of the clock signal CLK 224, when signal EN 226 is active (high) and signal RSTN is inactive (high). When the low phase counter 248 matches the value in the low phase glitch width register 246, the output D 251 of the low phase comparator 249 is set to an active low logic level. That is, when the value C 247 at the "B" input of the low phase comparator 249 is equal to the value 241 at the "A" input, the output D 251 of the low phase comparator 249 is set to a low logic level. Additionally, the signal D 251 stops the low phase counter 248 from decrementing, and the low phase counter 248 remains at the value in the low phase glitch width register 246 until a reset of the low phase counter 248 is caused by the input signal DI 220, or by the reset signal RSTN 222. The value of signal D 251 is latched into the flip-flop FF2 254 at the next rising edge of the clock signal CLK 224. The output F 256 of the flip-flop FF2 254 then changes to a low logic level, and the flip-flop FF3 257 is reset, forcing the output H 258 of the flip-flop FF3 257 to a low logic level and passed to debounced output DO 260. If the duration of a low logic level portion (i.e., a "negative glitch") of the input signal DI 220 is shorter than the value in the low phase glitch width register 246, the value of low phase counter 248 will never match the value of the low phase glitch width register 246, and the output D 251 of the comparator 249 will not go to a low logic level. Therefore, the output F 256 of flip-flop FF2 254 will not be set to a low logic level, and will not reset the state of the flip-flop FF3 257. The output H 258 of the flip-flop FF3 257 will remain at a high logic level, and the value of the output H 258 will be passed to the output signal DO 260 by multiplexer 259. Any change of input signal DI 220 to a high logic level resets the low phase counter 248 to the "all-zeros" condition and forces signal D 251 to a high logic level. The high logic level of signal D 251 is latched into flip-flop FF2 254 after one clock cycle, but the output signal F 256 of flip-flop FF2 254 does not trigger the state of flip-flop FF3 257 to a high logic level, because the high logic level of signal F 256 cannot reset flip-flop FF3 257. In this manner, any negative glitches (i.e., low logic level portion) in the input signal DI 220 having a duration of less that the value of the low phase glitch width register 246 will not be passed to the output DO 260.

In a representative embodiment of the present invention, flip-flop FF1 253 and flip-flop FF2 254 are used to synchronize output B 250 and output D 251 of the high phase comparator 245 and the low phase comparator 249, respectively, to avoid generating any new glitches in the output signal DO 260. Although the illustrations of FIGS. 2A and 2B include flip-flops FF1 253 and FF2 254, these components may not be necessary in all representative embodiments of the present invention. For example, the use of flip-flops FF1 253 and FF2 254 may be avoided when the comparators 245, 249 do not generate glitches. An example of such a technique may be the use of only one bit of the output of counters 244, 248 in the comparison with the high/low phase glitch width registers 242, 246, respectively. More specifically, such a technique may use the values of the high/low phase glitch width registers 242, 246 to select different bits of the counters 244, 248 to trigger the signals B 250 or D 251, respectively. In such an embodiment, the one selected bit of the output from the high and/or low phase counters 244, 248 should not have glitches, and may not necessitate the use of flip-flops FF1 253 and/or FF2 254.

Figure 2C:
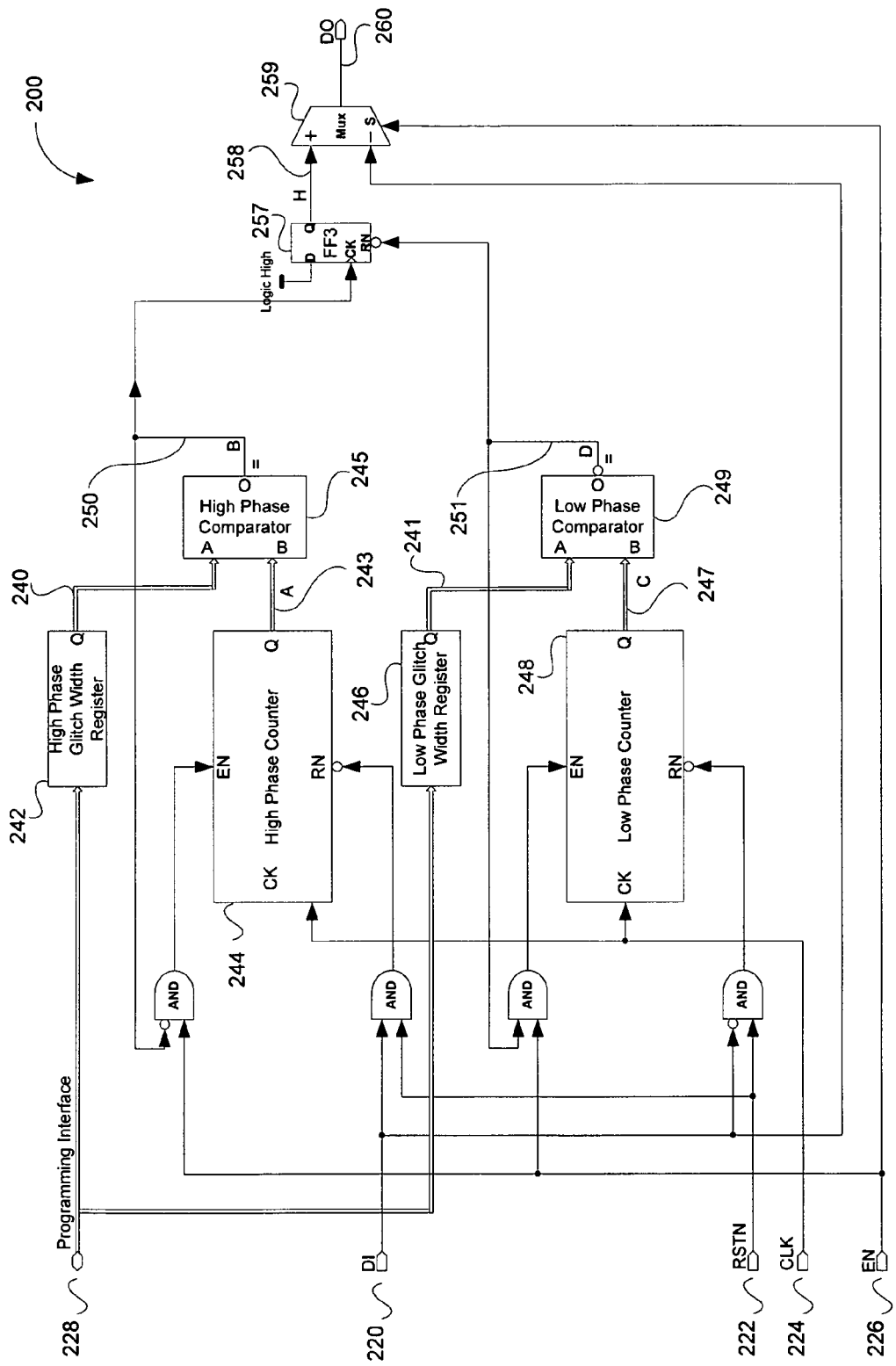
FIG. 2C is a block diagram of another exemplary debounce circuit for processing an input signal DI to produce an output signal DO, in accordance with a representative embodiment of the present invention.

FIG. 2C is a block diagram of another exemplary debounce circuit 200 for processing an input signal DI 220 to produce an output signal DO 260, in accordance with a representative embodiment of the present invention. The circuit of FIG. 2C is similar to that shown in FIG. 2B, with the exception that flip-flop FF1 253 and flip-flop FF2 254 of FIG. 2B have been eliminated. A representative embodiment of the present invention as illustrated in FIG. 2C may be employed when comparators 245, 249 do not produce glitches. The operation of the circuit shown in FIG. 2C has been modified from that in FIG. 2B, in that the outputs of comparators 245, 249 are not latched by the signal CLK 224 into the flip-flop FF1 253 and flip-flop FF2. Instead, the rising edge of signal B 250 causes the output H 258 of flip-flop FF3 257 to transition to a high logic level. This transition is possible because the low phase counter 248 is in a reset state, which causes the output D 251 of the comparator 249 to be at a high logic level. The output H 258 of flip-flop FF3 is reset to a low logic level when the output D 251 of the comparator 249 changes to a low logic level. The output H 258 of flip-flop FF3 257 is then passed to the output DO 260. The behavior of the circuitry generating output B 250 and output D 251 of comparators 245, 249, respectively, is described above with respect to FIG. 2A, 2B.

Figure 2D:
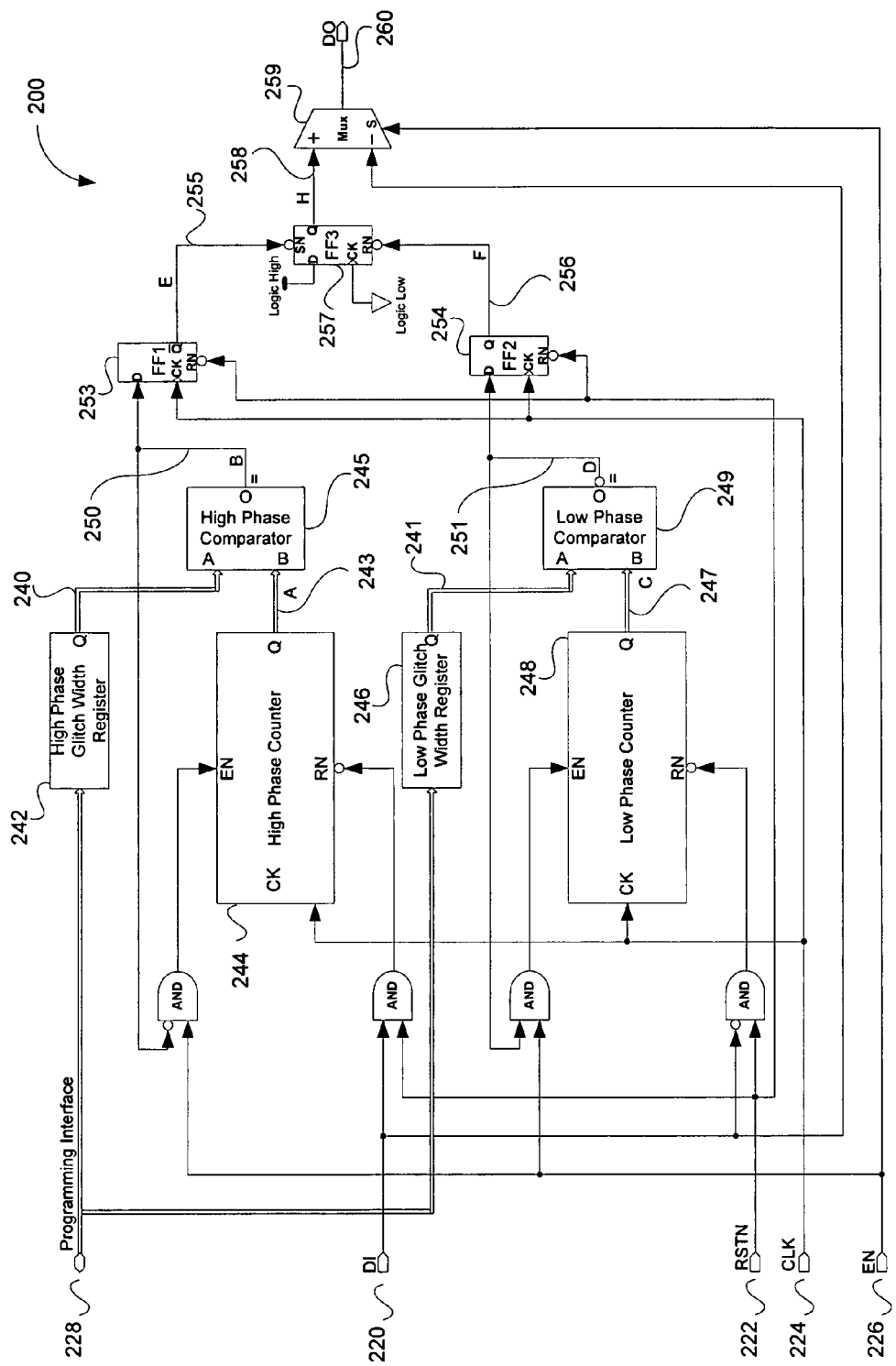
FIG. 2D is a block diagram of another exemplary debounce circuit for processing an input signal DI to produce an output signal DO, in accordance with a representative embodiment of the present invention.

FIG. 2D is a block diagram of another exemplary debounce circuit 200 for processing an input signal DI 220 to produce an output signal DO 260, in accordance with a representative embodiment of the present invention. The circuit of FIG. 2D is similar to that shown in FIG. 2B, with the exception that flip-flop FF3 257 is now operated as a set-reset flip-flop rather than the edge-triggered flip-flop shown in FIGS. 2A, 2B, 2C. In the embodiment illustrated in FIG. 2D, the output E 255 of flip-flop FF1 253 now comes from the inverted output of FF1

253, and is passed to the active low set input SN of flip-flop FF3 257. The output B 250 of comparator 245 is latched into the flip-flop FF1 253 as described above with respect to FIGS. 2A, 2B. However, in the illustration of FIG. 2D it is the low logic level rather than the rising edge of the output E 255 that causes the output 258 of flip-flop FF3 257 to change to a high logic level. Flip-flop FF3 257 is reset in the same fashion described above with respect to FIGS. 2A, 2B, when the output D 251 of comparator 249 changes to a high logic level.

Figure 2E:
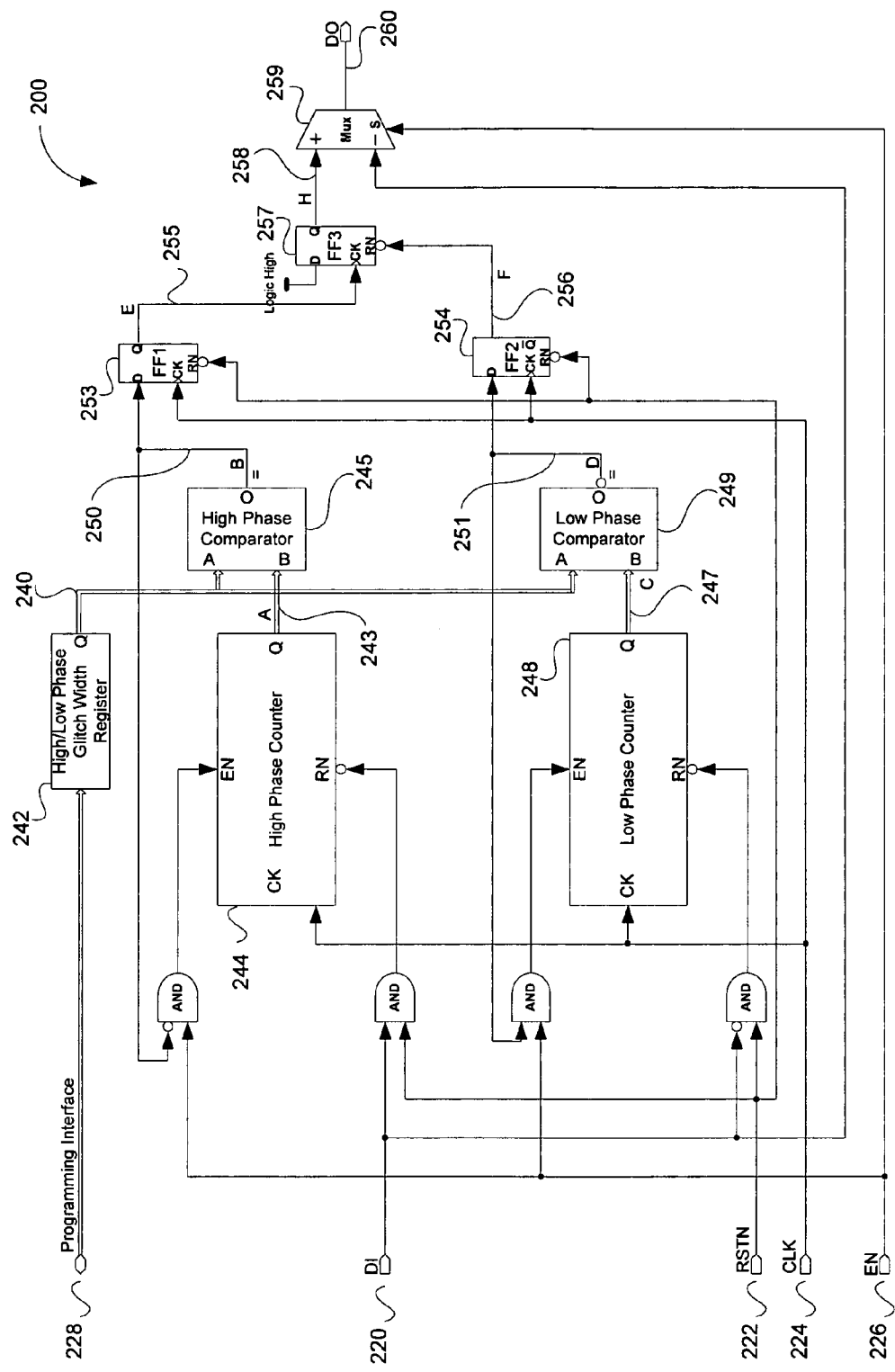
FIG. 2E is a block diagram of another exemplary debounce circuit for processing an input signal DI to produce an output signal DO, in accordance with a representative embodiment of the present invention.

FIG. 2E is a block diagram of another exemplary debounce circuit 200 for processing an input signal DI 220 to produce an output signal DO 260, in accordance with a representative embodiment of the present invention. In a representative embodiment of the present invention, the values provided by the high phase glitch width register 242 and the low phase glitch width register 246 of FIGS. 2A, 2B 2C, 2D, may instead be provided by a single merged high/low phase glitch width register 242, as shown in FIG. 2E. This arrangement may be employed when both the high and low phase counters 244, 248 count in the same direction (i.e., up or down), and when the expected high and low state bounce/glitch characteristics of the input signal DI 220 are similar. In a representative embodiment in which the high and low phase counters 244 and 248 count in different directions, the filtering behavior for positive-going and negative-going glitches may not be the same. As shown in FIG. 2E, such an embodiment avoids the use of separate high and low phase glitch width registers, saving integrated circuit chip area and reducing chip cost.

Figure 2F:
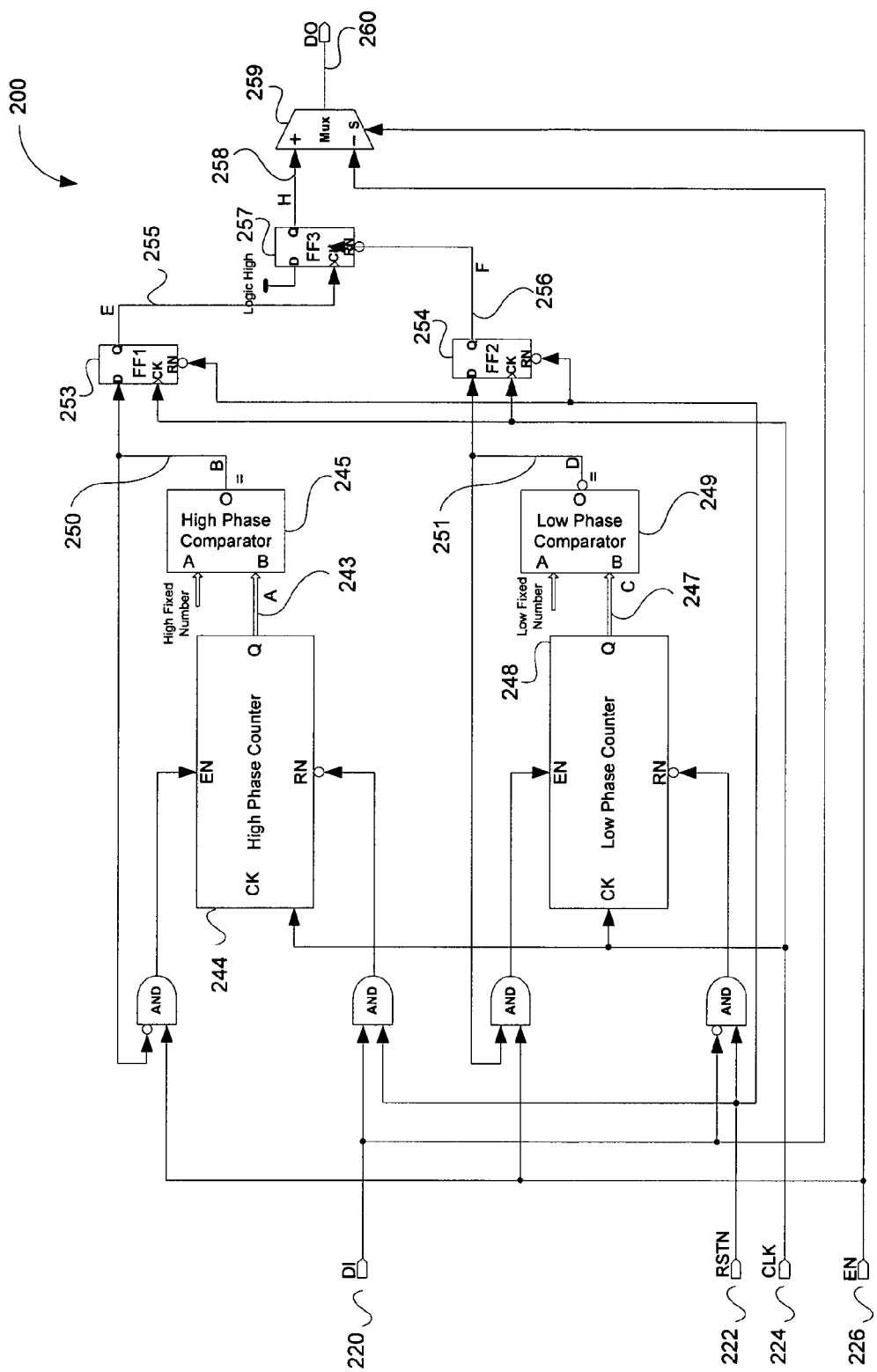
FIG. 2F is a block diagram of another exemplary debounce circuit for processing an input signal DI to produce an output signal DO, in accordance with a representative embodiment of the present invention.

FIG. 2F is a block diagram of another exemplary debounce circuit 200 for processing an input signal DI 220 to produce an output signal DO 260, in accordance with a representative embodiment of the present invention. In a representative embodiment of the present invention, the values provided by the high phase glitch width register 242 and the low phase glitch width register 246 of FIGS. 2A, 2B 2C, 2D, may instead be set to fixed values, as shown in FIG. 2F. This arrangement may be employed when both the high and low phase counters 244, 248 count in the same direction (i.e., up or down), or in different directions, and when the bounce/glitch characteristics of the input signal DI 220 are well known and programmability of the operation of the debounce circuit 200 is not desirable. As shown in FIG. 2F, such an embodiment avoids the use of high and low phase glitch width registers 242, 246, and the circuitry used to allow programming of the high and low phase glitch width registers 242, 246. The use of such a representative embodiment of the present invention saves integrated circuit chip area and cost when the flexibility of the other arrangements described above with respect to FIGS. 2A, 2B, 2C, 2D, and 2E are not desired.

Figure 3:
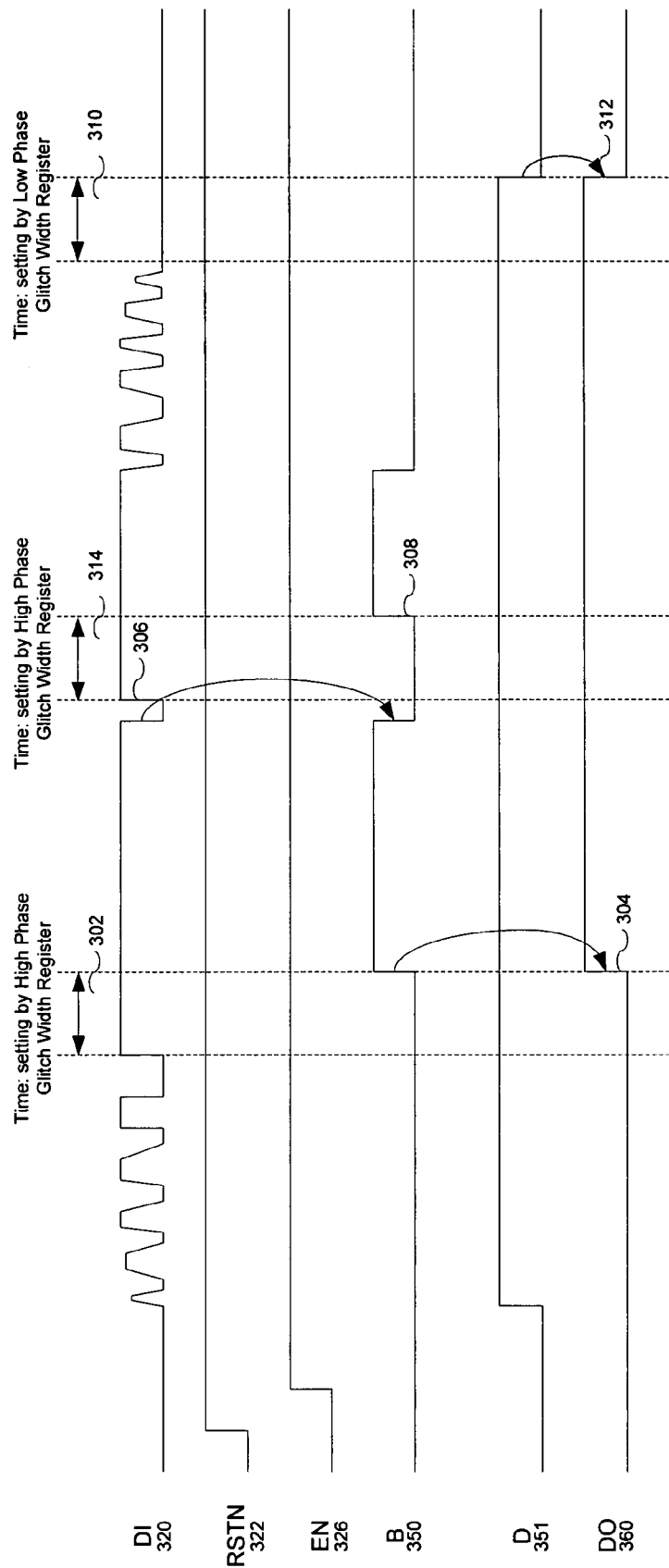
FIG. 3 shows exemplary waveforms of signals RSTN, EN, B, D, and DO, that may correspond, for example, to signals RSTN, EN, B, D, and output signal DO of the debounce circuit of FIG. 2A in the presence of an active high input signal DI that may correspond, for example, to the input signal DI of FIG. 2A, in accordance with a representative embodiment of the present invention.

FIG. 3 shows exemplary waveforms of signals RSTN 322, EN 326, B 350, D 351, and DO 360, that may correspond, for example, to signals RSTN 222, EN 226, B 250, D 251, and output signal DO 260 of the debounce circuit 200 of FIG. 2A in the presence of an active high input signal DI 320 that may correspond, for example, to the input signal DI 220 of FIG. 2A, in accordance with a representative embodiment of the present invention. The waveforms shown in FIG. 3 provide a graphical representation of the behavior described above with respect to the debounce circuit 200 of FIG. 2A. In the illustration of FIG. 3, the signal B 350 is set to an active high logic level after signal DI 320 remains at a high logic level for a time interval 302. The time interval 302 may be determined, for example, by the value stored in the high phase glitch width register 242 of the debounce circuit 200 of FIG. 2A. The level of signal B 350 later triggers output DO 360 to a high logic level after two clock cycles, at time 304. The level of signal D 351 is set low after signal DI 320 remains at a low logic level for a time period 310. The duration of the time period 310 may be determined, for example, by the value stored in the low phase glitch width register 246 of the debounce circuit 200 of FIG. 2A. The fall of signal D 351 later triggers output DO 360 to a low logic level after one clock cycle, at time 312. In this manner, the signal DO 360 is output as a clean signal, without the glitches that appear during leading and trailing portions of the signal DI 320 shown in FIG. 3. The duration of the low and high portions of the signal DO 360 closely approximates the duration of the low and high portions of the signal DI 320. In addition, although a noise spike 306 appears in the mid-portion of the signal DI 320, the logic low duration of the noise spike 306 is shorter than the time period 310 that is set in the low phase glitch width register 246 of FIG. 2A and, therefore, does not appear in the signal DO 360.

Figure 4:
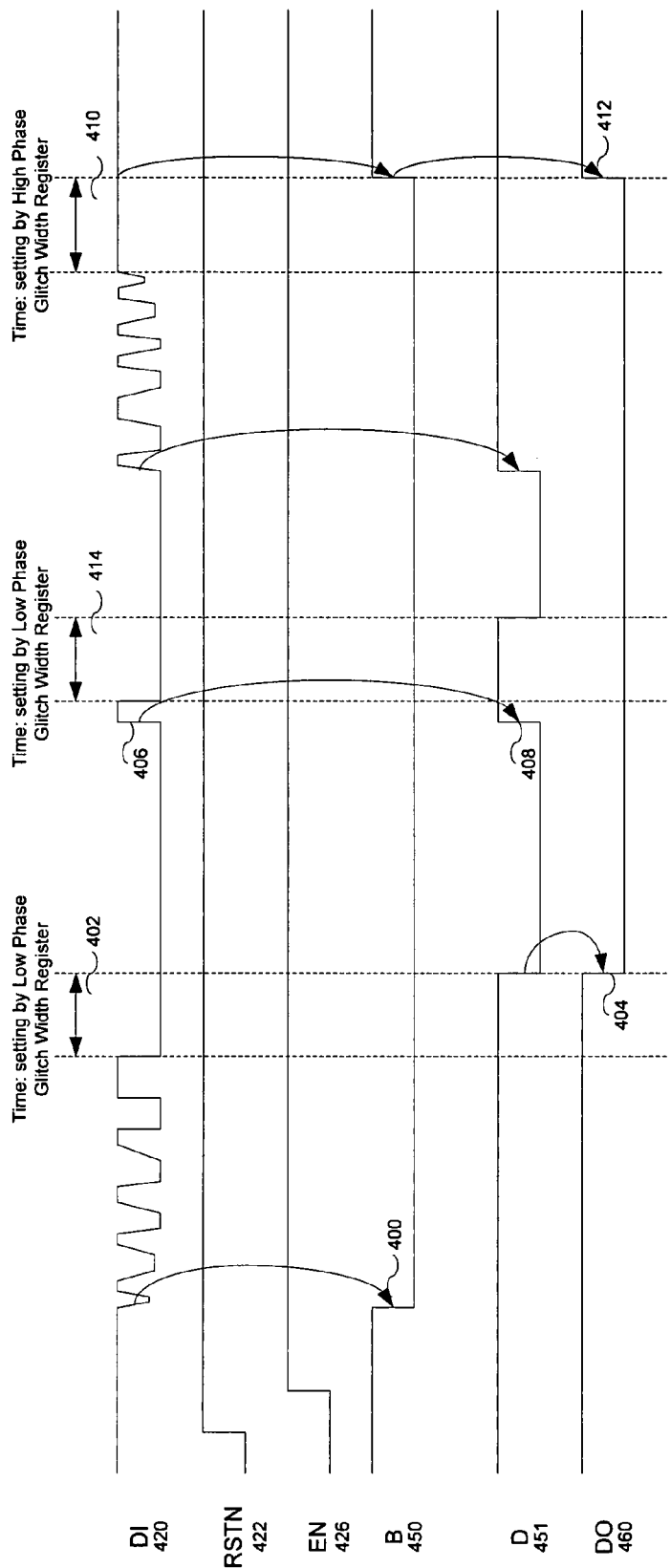
FIG. 4 shows exemplary waveforms of signals RSTN, EN, B, D, and DO, that may correspond, for example, to signals RSTN, EN, B, D, and output signal DO of the debounce circuit of FIG. 2A in the presence of an active low input signal DI that may, for example, correspond to the input signal DI of FIG. 2A, in accordance with a representative embodiment of the present invention.

FIG. 4 shows exemplary waveforms of signals RSTN 422, EN 426, B 450, D 451, and DO 460, that may correspond, for example, to signals RSTN 222, EN 226, B 250, D 251, and output signal DO 260 of the debounce circuit 200 of FIG. 2A in the presence of an active low input signal DI 420 that may, for example, correspond to the input signal DI 220 of FIG. 2A, in accordance with a representative embodiment of the present invention. The waveforms shown in FIG. 4 provide a graphical representation of the behavior described above with respect to the debounce circuit 200 of FIG. 2A. In the illustration of FIG. 4, the signal B 450 is set to an active low logic level at 400 following the first negative transition of the input signal DI 420. The signal D 451 changes to a low logic level once the input signal DI 420 remains at a low logic level for a time period 402 that maybe determined by, for example, the value stored in the low phase glitch width register 246 of FIG. 2A. That change in signal D 451 later appears at signal DO 460 after one clock cycle, at time 404. The signal B 450 transitions to a high logic level after the signal DI 420 remains at a high logic level for time period 410 that may be determined by, for example, the value stored in the high phase glitch width register 242 of FIG. 2A. The rise of signal B 450 propagates to force the signal DO 460 to a logic high state after two clock cycles, at time 412. The signal DI 420 is processed to produce a clean signal DO 460 without the noise spikes (i.e., glitches) that appear at the leading and trailing portions of the waveform of the DI 420 signal. The length of the low logic level portion of signal DO 460 is approximately the same as the length of the low logic level portion of signal DI 420, resulting in a balanced debouncing action. Although a positive noise spike 406 appears in the mid-portion of the signal DI 420, the logic high duration of the noise spike 406 is shorter than the time period 410 that is set in the high phase glitch width register 242 of FIG. 2A and, therefore, does not appear in the signal DO 460.

Figure 5:
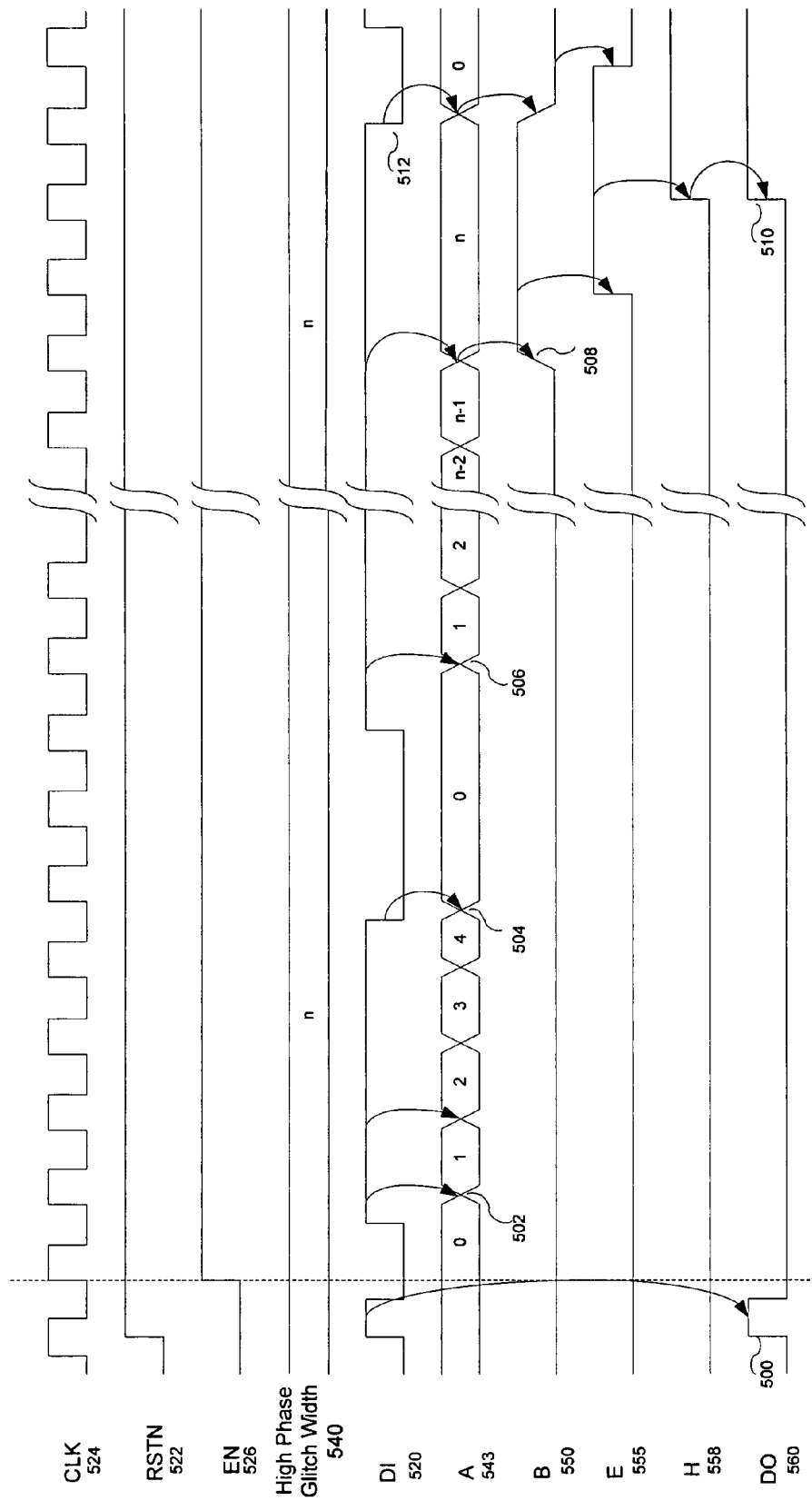
FIG. 5 shows the waveforms of signals CLK, RSTN, EN, High Phase Glitch Width, DI, A, B, E, H, and DO, that may correspond, for example, to the signals CLK, RSTN, EN, High Phase Glitch Width, DI, A, B, E, H, and DO of the debouncing circuit of FIG. 2A, illustrating the operation of a high phase counter that may correspond, for example, to the high phase counter of FIG. 2A, in accordance with a representative embodiment of the present invention.

FIG. 5 shows the waveforms of signals CLK 524, RSTN 522, EN 526, High Phase Glitch Width 540, DI 520, A 543, B 550, E 555, H 558, and DO 560, that may correspond, for example, to the signals CLK 224, RSTN 222, EN 226, High Phase Glitch Width 240, DI 220, A 243, B 250, E 255, H 258, and DO 260 of the debouncing circuit 200 of FIG. 2A, illustrating the operation of a high phase counter that may correspond, for example, to the high phase counter 244 of FIG. 2A, in accordance with a representative embodiment of the present invention. In order to clarify the operation of a representative embodiment of the present invention, the following description makes references to the elements of FIG. 2A. As shown in FIG. 5, any glitches on signal DI 520 may be propagated to signal DO 560 during the time period when signal EN 526 is at a low logic level (inactive), such as, for example, at time 500. After signal EN 526 is set to a high logic level (active), however, the high logic level of signal DI 520 permits the high phase counter 244 to increment at every rise edge of the clock signal CLK 524, beginning at time 502. At time 504, signal DI 520 transitions to a low logic level, causing the high phase counter 244 to be immediately reset to the "all zeros" state. Following a change in signal DI 520 to a high logic level at 506, the high phase counter 244 once again begins incrementing at each rising edge of the CLK 524, until a match with the value in the high phase glitch width register 242 (shown in FIG. 5 as signal value "n") occurs at 508. At that point, signal B 550 changes to a high logic level, and the value of signal B 550 then propagates to the signal DO 560 after two clock cycles, at 510. Although there is a negative noise spike in signal DI 520 at 512, the noise spike is of too short a duration to trigger the transition of signal DO 560 to a low logic level as described above.

Figure 6:
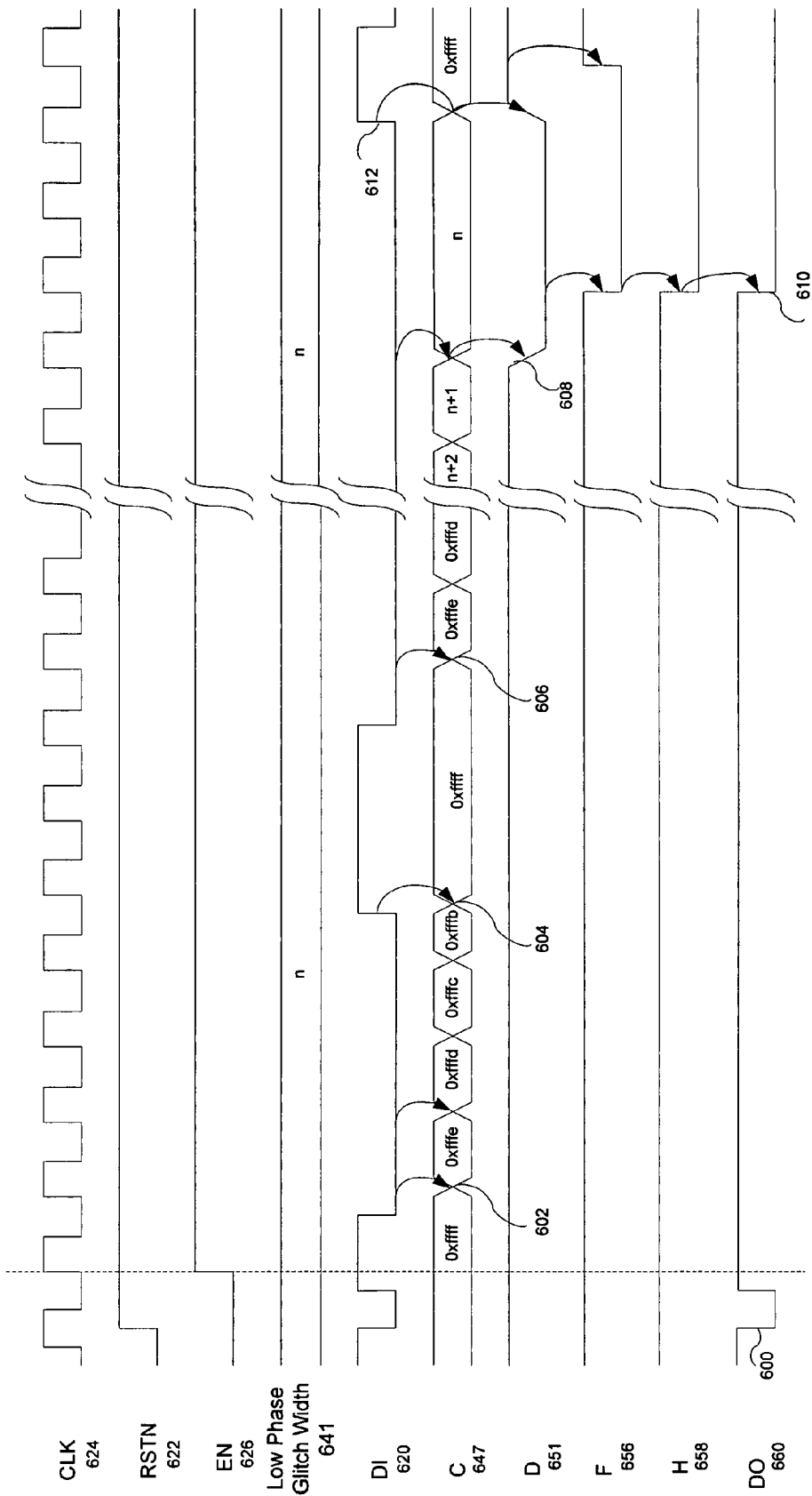
FIG. 6 shows the waveforms of signals CLK, RSTN, EN, Low Phase Glitch Width, DI, C, D, F, H, and DO, that may correspond, for example, to the signals CLK, RSTN, EN, Low Phase Glitch Width, DI, C, D, F, H, and DO of the debouncing circuit of FIG. 2A, illustrating the operation of a low phase counter that may correspond, for example, to the low phase counter of FIG. 2A, in accordance with a representative embodiment of the present invention.

FIG. 6 shows the waveforms of signals CLK 624, RSTN 622, EN 626, Low Phase Glitch Width 641, DI 620, C 647, D 651, F 656, H 658, and DO 660, that may correspond, for example, to the signals CLK 224, RSTN 222, EN 226, Low Phase Glitch 241, DI 220, C 247, D 251, F 256, H 258, and DO 260 of the debouncing circuit 200 of FIG. 2A, illustrating the operation of a low phase counter that may correspond, for example, to the low phase counter 248 of FIG. 2A, in accordance with a representative embodiment of the present invention. In order to clarify the operation of a representative embodiment of the present invention, the following description makes references to the elements of FIG. 2A. As shown in FIG. 6, any glitches on signal DI 620 may be propagated to signal DO 660 during the time period when signal EN 626 is at a low logic level (inactive), such as, for example, at time 600. After signal EN 626 is set to a high logic level (active), however, the low logic level of signal DI 620 permits the low phase counter 248 to decrement at every rise edge of the clock signal CLK 624, beginning at time 602. At time 604, signal DI 620 transitions to a high logic level, causing the low phase counter 248 to be immediately reset to the "all ones" state. Following a change in signal DI 620 to a low logic level, the low phase counter 248 once again begins at 606 to decrement at each rising edge of the CLK 624, until a match with the value in the low phase glitch width register 246 (shown in FIG. 6 as signal value "n") occurs at 608. At that point, signal D 651 changes to a low logic level, and the value of signal D 651 then propagates to the signal DO 660 after the next rising edge of the clock CLK 624, at 610. Although there is a positive noise spike in signal DI 620 at 612, the noise spike is of too short a duration to trigger the transition of signal DO 660 to a high logic level.

Figure 7:
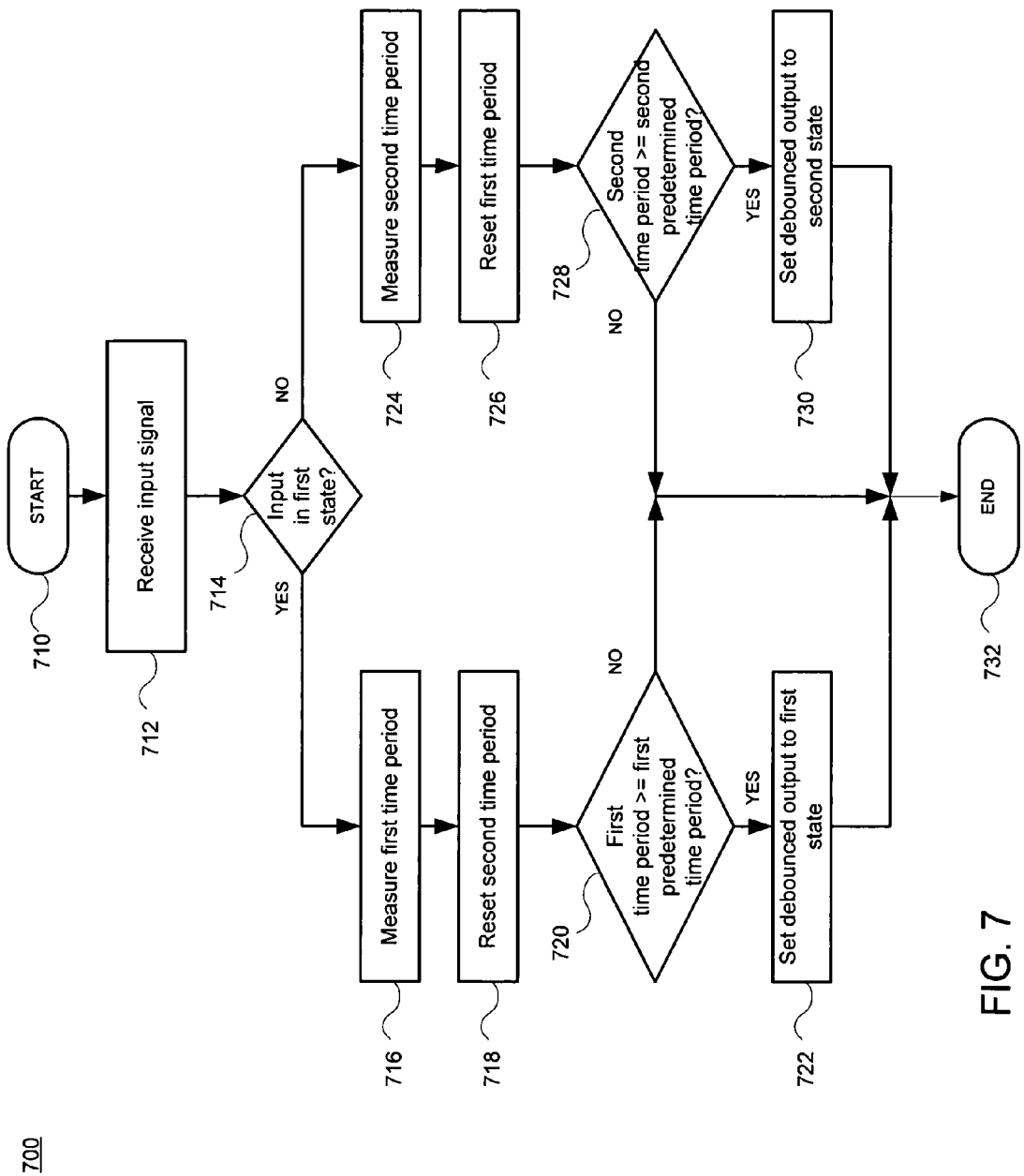
FIG. 7 is a flowchart illustrating an exemplary method of debouncing an input signal that produces a debounced output signal in accordance with a representative embodiment of the present invention.

FIG. 7 is a flowchart 700 illustrating an exemplary method of debouncing an input signal that produces a debounced output signal in accordance with a representative embodiment of the present invention. Although the method of FIG. 7 is shown as having a start and an end, this is for reasons of clarity. In a representative embodiment of the present invention, the method shown in FIG. 7 may be performed on a repeated and/or continuous basis and never stopped, for example, once power-up of a system employing the method has occurred, beginning at the start (block 710). An input signal is received (block 714) and it is determined whether the input signal is in a first state (block 714). If the input signal is determined to be in the first state (block 714), a measurement of a first time period may be made (block 716), and a second time period may be reset to a second predetermined value (block 718). It is then determined whether the first time period is greater than or equal to a first predetermined time period (block 720). If the first time period is not greater than or equal to the first predetermined time period (block 720), the method then finishes (block 732). If the first time period is greater than or equal to the first predetermined time period (block 720), then a debounced output signal may be set to the first state (block 722), and the method finishes (block 732). As stated above, the method illustrated in FIG. 7 may be performed in a continuous, concurrent, and never ending fashion. The illustration of FIG. 7 terminates at an end (block 732) solely for reasons of clarity.

If the input signal is determined not to be in the first state (block 714), it may be considered to be in a second state, and a measurement of a second time period may be made (block 724). In addition, the first time period may be reset to a first predetermined value (block 726). It is then determined whether the second time period is greater than or equal to a second predetermined time period (block 728). If the second time period is not greater than or equal to the second predetermined time period (block 728), the method finishes (block 732). If the second time period is greater than or equal to the second predetermined time period (block 728), then the debounced output signal may be set to the second state (block 730), and the method finishes (block 732). As described above, the method illustrated in FIG. 7 may be performed in a continuous, concurrent, and never-ending fashion. The illustration of FIG. 7 terminates at an end (block 732) solely for reasons of clarity.

The present invention overcomes many of the drawbacks of conventional and traditional approaches. First, a representative embodiment of the present invention uses digital circuitry to replace analog components typically used to perform filtering. It is thus easy to integrate into a digital system, and may be implemented as software in a computer system. Second, a representative embodiment of the present invention uses two sets of complementary counters and comparators to filter both positive and negative going bounces or "both directions of glitches" from an input signal. This results in a debounced output signal having a length substantially equal to that of the input signal, and from which glitches have been filtered in addition to any noise that may be present in the leading and trailing portions of the input signal. In addition, any glitches having a width that is smaller than the predetermined setting will be filtered out. Third, a representative embodiment of the present invention supports programming of the width of any signal bounce to be filtered. This provides flexibility for use with difference switches having a wide variety of bounce characteristics.

Aspects of the present invention may be found in a circuit for debouncing an input signal having at least a first state and a second state. In a representative embodiment of the present invention, the circuit may comprise a first counter responding to a clock signal while the input signal is in the first state, and maintained at a first reset value while the input signal is in the second state, the first counter producing an output. Such an embodiment may also comprise a second counter that responds to the clock signal while the input signal is in the second state, and is maintained at a second reset value while the input signal is in the first state, where the second counter produces an output. Such a circuit may comprise a first comparator that produces an output indicating whether a match of the first output to a first predetermined value exists, and a second comparator that produces an output indicating whether a match of the second output to a second predetermined value exists. In addition, such a circuit may comprise a latch having an output that is set to the first state when a match of the first output to a first predetermined value exists, and that is set to the second state when a match of the second output to a second predetermined value exists. A representative embodiment in accordance with the present invention may also comprise a second latch for storing the output of the first comparator, based upon the clock signal, and a third latch for storing the output of the second comparator, based upon the clock signal.

A representative embodiment of the present invention may comprise a first register for holding the first predetermined value, and a second register for holding the second predetermined value, and a multiplexer for selecting one of the input signal and the output of the third latch based upon a second input signal. The first counter and the second counter may be enabled to count based upon a second input signal. In a representative embodiment of the present invention, each of the first counter and the second counter may be maintained in one of at least one predetermined state based upon a third input signal. In one representative embodiment of the present invention, the first counter may be an up-counter and the second counter may be a down-counter. In another representative embodiment of the present invention, the first counter and the second counter may be up-counters. In yet another representative embodiment of the present invention, the first counter and the second counter may be down-counters.

Additional aspects of the present invention may be seen in a debouncing circuit for filtering an input signal having at least a first state and a second state. A representative embodiment in accordance with the present invention may comprise a first timing circuit for measuring a first time period while the input signal is in the first state, where the first timing circuit is responsive to a clock input while the input signal is in the first state, and where the first timing circuit is held at a first reset value while the input signal is in the second state. Such an embodiment may also comprise a second timing circuit for measuring a second time period while the input signal is in the second state, where the second timing circuit is responsive to the clock input while the input signal is in the second state, and where the second timing circuit is held at a second reset value while the input signal is in the first state. Such an embodiment may also comprise a deglitching circuit that produces, in response to the clock input, an output signal taking the first state when the first time period is at least a first predetermined value, and taking the second state when the second time period is at least a second predetermined value.

In a representative embodiment of the present invention, the input signal may be passed essentially unchanged to the output signal depending upon a state of a second input signal. A representative embodiment of the present invention may also comprise an interface for receiving at least one of the first predetermined value and the second predetermined value. In addition, such an embodiment may comprise a first register for storing the first predetermined value, and a second register for storing the second predetermined value. At least a portion of the circuit may be powered down depending upon a state of one of the second input signal and a third input signal.

Yet other aspects of the present invention may be observed in a method of debouncing an input signal having at least a first state and a second state to produce an output signal. Such a method may comprise measuring a first time period and resetting a second time period, while the input signal is in the first state, and measuring the second time period and resetting the first time period, while the input signal is in the second state. A method in accordance with the present invention may also comprise setting the output signal to the first state, if the first time period is at least a first predetermined time period, and setting the output signal to the second state, if the second time period is at least a second predetermined time period. Measuring the first time period, measuring the second time period, setting the output signal to the first state, and setting the output signal to the second state may be based upon a common clock signal. In addition, the input signal may be reproduced essentially unchanged at the output signal depending upon a state of a second input signal.

Still other aspects of the invention may be found in a machine-readable storage, having stored thereon a computer program having a plurality of code sections executable by a machine for causing the machine to perform the method described above.

Yet other aspects of the present invention may be observed in a digital circuit for debouncing an input signal having a first state and a second state and producing an output. The circuit may be disposed entirely within an integrated circuit device and may function at least to communicate to the output only changes of input signal state occurring at least a predetermined period of time after the most recent previous change of input signal state. The predetermined period of time in a representative embodiment of the present invention, may be programmable, and may comprise a first predetermined period of time used when the input signal is in the first state, and a second predetermined period of time used when the input signal is in the second state. The input signal may be passed essentially unchanged to the output based upon a second input signal, and changes in the output may be responsive to a clock signal.

Additional aspects of the present invention may be seen in a digital circuit for debouncing an input signal having a first state and a second state. The circuit may be disposed within an integrated circuit device. The circuit may function at least to produce an output signal having a predetermined minimum period of time between output state transitions without the use of at least one of an resistor and a capacitor for setting the predetermined minimum period of time. The predetermined minimum period of time may be programmable, and comprise a first period of time corresponding to the first input state and a second period of time corresponding to the second input state. The predetermined minimum period of time may beis based upon a clock signal, and the input signal may be passed essentially unchanged to the output signal based upon a second input signal.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A circuit for debouncing an input signal having at least a first state and a second state, comprising:
   a first counter configured to respond to a clock signal while the input signal is in the first state, and that is maintained at a first reset value while the input signal is in the second state, the first counter producing a first output;
   a second counter configured to respond to the clock signal while the input signal is in the second state, and that is maintained at a second reset value while the input signal is in the first state, the second counter producing a second output;
   a first comparator configured to produce a third output indicative of whether the first output matches a first predetermined value;
   a second comparator configured to produce a fourth output indicative of whether the second output matches a second predetermined value; and
   a latch configured to produce a fifth output that is set to the first state when the first output matches the first predetermined value, and that is set to the second state when the second output matches the second predetermined value.

2. The circuit according to claim 1, further comprising:
   a second latch configured to store the third output ; and
   a third latch configured to store the fourth output.

3. The circuit according to claim 1, further comprising:
   a first register configured to store the first predetermined value.

4. The circuit according to claim 3, further comprising:
   a second register configured to store the second predetermined value.

5. The circuit according to claim 1, further comprising:
   a multiplexer configured to select either the input signal or an output of the latch based upon a second input signal.

6. The circuit according to claim 1, wherein the first counter and the second counter are further configured to enable counting based upon a second input signal.

7. The circuit according to claim 1, wherein the first counter and the second counter are further configured to maintain the first and second reset values, respectively, based upon a second input signal.

8. The circuit according to claim 1, wherein the first counter is an up-counter, and wherein the second counter is a down-counter.

9. The circuit according to claim 1, wherein the first counter is an up-counter, and wherein the second counter is an up-counter.

10. The circuit according to claim 1, wherein the first counter is a down-counter, and wherein the second counter is a down-counter.

11. A debouncing circuit for filtering an input signal having at least a first state and a second state, comprising:
    a first timing circuit configured to measure a first time period while the input signal is in the first state, to respond to a clock input while the input signal is in the first state, and to maintain a first reset value while the input signal is in the second state;
    a second timing circuit configured to measure a second time period while the input signal is in the second state, to respond to the clock input while the input signal is in the second state, and to maintain a second reset value while the input signal is in the first state, and
    wherein the debouncing circuit produces, an output signal in response to the clock input, the output signal being set to the first state when the first time period is at least a first predetermined value, and the output signal being set to the second state when the second time period is at least a second predetermined value.

12. The circuit according to claim 11 further comprising:
    a multiplexer configured to select either the input signal or the output signal depending upon a state of a second input signal.

13. The circuit according to claim 11, further comprising:
    a first register configured to store the first predetermined value; and
    a second register configured to store the second predetermined value.

14. The circuit according to claim 11, wherein a portion of the circuit is powered down depending upon a state of a second input signal or a third input signal.

15. A method of debouncing an input signal having at least a first state and a second state to produce an output signal, comprising:
    measuring a first time period and resetting a second time period, while the input signal is in the first state;
    measuring the second time period and resetting the first time period, while the input signal is in the second state;
    setting the output signal to the first state when the first time period is at least a first predetermined time period; and
    setting the output signal to the second state when the second time period is at least a second predetermined time period.

16. The method according to claim 15, wherein the measuring the first time period, the measuring the second time period, the setting the output signal to the first state, and the setting the output signal to the second state are based upon a common clock signal.

17. The method according to claim 15, further comprising:
    selecting either the input signal or the output signal depending upon a state of a second input signal.

18. A non-transitory tangible computer-readable medium having instructions stored thereon to debounce an input signal having at least a first state and a second state to produce an output signal, the instructions comprising:
    measuring a first time period and resetting a second time period, while the input signal is in the first state;
    measuring the second time period and resetting the first time period, while the input signal is in the second state;
    setting the output signal to the first state when the first time period is at least a first predetermined time period; and
    setting the output signal to the second state when the second time period is at least a second predetermined time period.

19. The non-transitory tangible computer-readable medium according to claim 18, wherein the instructions for measuring the first time period, measuring the second time period, setting the output signal to the first state, and setting the output signal to the second state are based upon a common clock signal.

20. The non-transitory tangible computer-readable medium according to claim 18, wherein the instructions further comprise:
    selecting either the input signal or the output signal depending upon a state of a second input signal.

* * * * *

UNITED STATES PATENT AND TRADEMARK OFFICE
CERTIFICATE OF CORRECTION

PATENT NO. : 8,502,593 B2
APPLICATION NO. : 11/080296
DATED : August 6, 2013
INVENTOR(S) : Lu et al.

It is certified that error appears in the above-identified patent and that said Letters Patent is hereby corrected as shown below:

In the Claims:

Column 15, line 19, "configared" should read --configured,--.

Column 16, line 4, "debouncing circuit produces, an" should read --debouncing circuit produces an--.

Column 16, line 10, "claim 11 further" should read --claim 11, further--.

Signed and Sealed this
Twelfth Day of November, 2013

Teresa Stanek Rea
*Deputy Director of the United States Patent and Trademark Office*